US008615093B2

(12) United States Patent
Hung et al.

(10) Patent No.: US 8,615,093 B2
(45) Date of Patent: Dec. 24, 2013

(54) APPARATUS AND METHOD FOR PROCESSING AUDIO SIGNAL

(75) Inventors: Tien-Chiu Hung, Banqiao (TW); Chung-Shih Chu, Hsinchu (TW); Tao-Cheng Wu, Zhubei (TW)

(73) Assignee: Realtek Semiconductor Corp., Hsinchu (TW)

( * ) Notice: Subject to any disclaimer, the term of this patent is extended or adjusted under 35 U.S.C. 154(b) by 859 days.

(21) Appl. No.: 12/571,744

(22) Filed: Oct. 1, 2009

(65) Prior Publication Data

US 2010/0086148 A1 Apr. 8, 2010

Related U.S. Application Data

(60) Provisional application No. 61/102,369, filed on Oct. 3, 2008.

(51) Int. Cl.
*H03G 5/00* (2006.01)

(52) U.S. Cl.
USPC ............................................. 381/98; 381/106

(58) Field of Classification Search
USPC ........... 381/1, 98, 345, 349, 103, 106, 17, 18, 381/99, 61, 104, 107, 119, 55, 59; 700/94
See application file for complete search history.

(56) References Cited

U.S. PATENT DOCUMENTS

| 4,490,691 A | * | 12/1984 | Dolby ............................. 333/14 |
| 5,668,885 A | | 9/1997 | Oda |
| 5,930,373 A | | 7/1999 | Shashoua et al. |
| 6,134,330 A | | 10/2000 | De Poortere et al. |
| 6,285,767 B1 | | 9/2001 | Klayman |
| 6,430,401 B1 | | 8/2002 | Lou et al. |
| 6,606,388 B1 | * | 8/2003 | Townsend et al. ............... 381/17 |
| 2003/0044023 A1 | | 3/2003 | Larsen |
| 2006/0034471 A1 | * | 2/2006 | Bongiovi ........................ 381/103 |
| 2006/0126851 A1 | * | 6/2006 | Yuen et al. ......................... 381/1 |
| 2006/0159283 A1 | | 7/2006 | Mathew et al. |
| 2008/0216637 A1 | | 9/2008 | Lin |

FOREIGN PATENT DOCUMENTS

| CN | 1342386 A | 3/2002 |
| WO | 2004062317 A1 | 7/2004 |

* cited by examiner

*Primary Examiner* — Vivian Chin
*Assistant Examiner* — Friedrich W Fahnert
(74) *Attorney, Agent, or Firm* — McClure, Qualey & Rodack, LLP

(57) ABSTRACT

An apparatus for processing an audio input signal is provided and includes an audio processing circuit and an audio compressing circuit. The audio processing circuit receives the audio input signal, and enhances a first frequency part of the audio input signal to output a bass-enhancement signal. The audio compressing circuit is coupled to the audio processing circuit, and reduces a gain of a second frequency part of the bass-enhancement signal to output an audio output signal.

18 Claims, 3 Drawing Sheets

APPARATUS AND METHOD FOR PROCESSING AUDIO SIGNAL

CROSS-REFERENCES TO RELATED APPLICATIONS

This application claims priority from U.S. Provisional Application No. 61/102,369, filed on Oct. 3, 2008, the contents of which are incorporated herewith for reference.

FIELD OF THE INVENTION

The present invention relates to an audio signal processing, and more particularly to an apparatus and method to process an audio signal for bass enhancement.

BACKGROUND OF THE INVENTION

Keeping portability in mind, consumer electronic devices today are designed. This design paradigm leads to smaller speakers in all portable electronic devices. The speaker having smaller physical dimension severely limits sound reproduction, especially in the low frequency registers, which leads the consumer to be dissatisfied with the sound output quality thereof. A conventional solution to this problem is to amplify the low frequency component of an audio input signal. However, this solution, increasing the energy level of the low frequency component, not only leads to extra power consumption, but also makes the speaker damage as well.

A better solution to improve the reproduction performance without boosting low frequency component is to utilize the psychoacoustic technique. The psychoacoustic technique demonstrates the existence of a phenomenon in harmonics known as "virtual pitch", in which the brain senses a frequency having the greatest common factor in harmonic frequencies, even if the amplitude of the fundamental frequency is zero. To illustrate, if the ear hears a tone having overtones with frequencies of 600, 800, 1000 and 1200 Hz, the pitch will nearly be identified as that of a 200 Hz tone.

A scheme in the prior art disclosed in U.S. Pat. No. 5,668,885 provides a low frequency audio conversion circuit. Another scheme in the prior art disclosed in U.S. Pat. No. 5,930,373 provides a psychoacoustic alternative signal generator; the focus of this patent is volume equalization; this means the loudness of the residue harmonic signal is brought to match the loudness of the low frequency signal. A further scheme in the prior art disclosed in U.S. Pat. No. 6,134,330 provides an enhancing device. A further scheme in the prior art disclosed in U.S. published patent No. 2006/0159283 provides a bass-enhancement circuit.

In practice, these audio systems often require the filter with low complexity in order to easily implement, and the speaker often shows the property of the cutoff frequency. The property causes the speaker difficult to reproduce the signal in the range out of the cutoff frequency. If the filter (e.g. a band pass filter) with the low complexity (low cost, in other word) is employed to implement, the original input signal still exists because the transition bandwidth is wide and the stop band is not approach to zero. The output energy is wasted because the output signal, processed by the band pass filter, still includes the original low frequency input signal which cannot be reproduced by the loudspeaker.

There is another drawback on the existence of the low frequency signal. A compressor is required in the system to avoid the levels of the output signal of the audio system going beyond the threshold of the loudspeaker. The compressor compresses the bass-enhancement signal back down below the threshold, wherein the compressor compresses not only the low frequency part of the bass-enhancement signal but also the high frequency part of the bass-enhancement signal. For instance, the output signal of the compressor has the high frequency part of the acoustic wave. When the output high frequency part is compared with the original high frequency part, the intensity of the output signal is much lower than that of the input signal. That is to say, the overall levels of the output signal increases when the low frequency part is present, which causes the compressor gain to be further decreased in order to avoid going beyond the threshold; thus, the high frequency part of the output signal of the compressor with the low frequency part is decreased more than that without the low frequency part.

Besides, the conventional method further has a drawback described as follows. In order to avoid the levels of the bass-enhancement signal going beyond the threshold of the speaker, the bass-enhancement signal (i.e. the gain is less than 1) is compressed. The whole of the bass-enhancement signal is compressed to be lower than the threshold, which causes the high frequency part of the bass-enhancement signal is compressed a lot and the output dynamic range of the bass-enhancement signal is also compressed.

SUMMARY OF THE INVENTION

It is one of objects of the present invention to provide an apparatus and method for processing an audio input signal, which improves that the output sound has poor quality when the speaker reproduces a low frequency signal.

It is one of the objects of the present invention to provide an apparatus and method for processing an audio input signal, which reduces the energy of the original audio input signal in the output signal.

It is one of the objects of the present invention to provide an apparatus and method for processing an audio input signal, which reduces the resulted waste of the output energy because the speaker cannot reproduce the low frequency signal.

It is one of the objects of the present invention to provide an apparatus and method for processing an audio input signal, which determines a bass-enhancement signal and reduces a gain of a low frequency part of the bass-enhancement signal for improving the dynamic range of the processed output signal.

It is an aspect of the present invention to provide an apparatus for processing an audio input signal. The apparatus includes an audio processing circuit and an audio compressing circuit. The audio processing circuit receives the audio input signal, and enhances a first frequency part of the audio input signal to output a bass-enhancement signal. The audio compressing circuit is coupled to the audio processing circuit, and reduces a gain of a second frequency part of the bass-enhancement signal to output an audio output signal.

It is another aspect of the present invention to provide a method for processing an audio input signal. The method includes the following steps. The audio input signal is received, and a first frequency part of the audio input signal is enhanced to output a bass-enhancement signal. In addition, a second frequency part of the bass-enhancement signal is compressed to output a compressed signal such that a gain of the second frequency part of the bass-enhancement signal is reduced.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
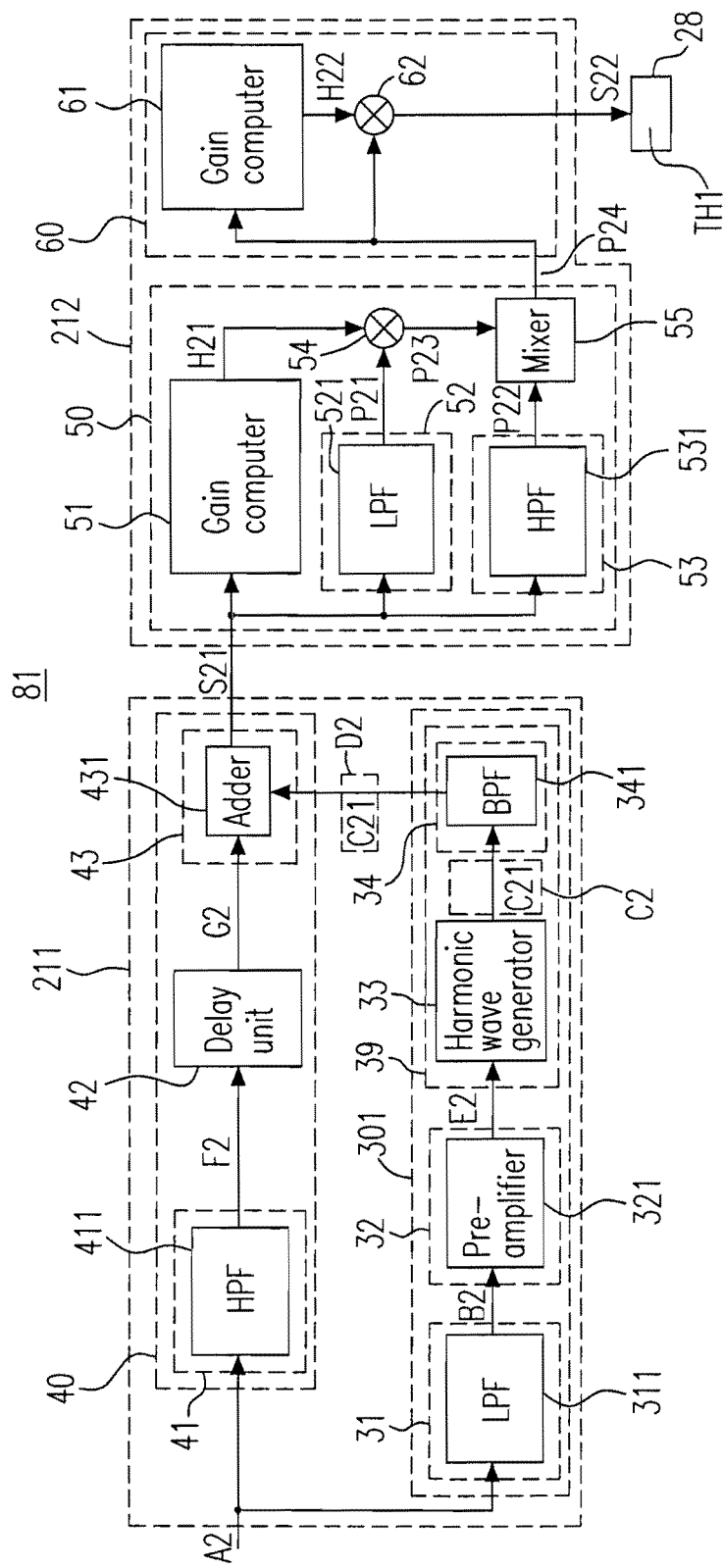
FIG. 1 is a schematic diagram showing an apparatus for processing an audio input signal according to the first embodiment of the present invention.

Please refer to FIG. 1, which is a schematic diagram showing the apparatus 81 for processing the audio input signal A2 according to the first embodiment of the present invention. As shown, the apparatus 81 includes the audio processing circuit 211 and the audio compressing circuit 212. The audio processing circuit 211 outputs the bass-enhancement signal S21 in response to the audio input signal A2. For instance, the audio processing circuit 211 enhances a frequency part, e.g. a low frequency part, of the audio input signal A2 to output the bass-enhancement signal S21, and the bass-enhancement signal S21 includes an overtone of the frequency part of the audio input signal A2. The audio compressing circuit 212 is coupled to the audio processing circuit 211, and reduces a gain of a frequency part, e.g. a low frequency part, of the bass-enhancement signal S21 to output the audio signal S22. A speaker 28 is coupled to the audio compressing circuit 212 and has the threshold TH1. The audio compressing circuit 212 outputs the audio signal S22 for driving the speaker 28. In an embodiment, the levels of the audio signal S22 is lower than the threshold TH1 for causing the speaker 28 to faithfully reproduce the sound of the audio signal S22. An embodying configuration of the audio compressing circuit 212 is an amplifying circuit the gain value of which is less than 1.

An embodying configuration of the audio processing circuit 211 may be any of conventional bass-enhancement systems or the embodiments disclosed in the present invention. In FIG. 1, the audio processing circuit 211 includes the first processing circuit 301 and the second processing circuit 40, each of which receives the audio input signal A2. The first processing circuit 301 uses the low frequency part B2 of the audio input signal A2 to output the harmonic signal D2, wherein the harmonic signal D2 includes the overtone C21 of the low frequency part B2 of the audio input signal A2. The second processing circuit 40 uses the harmonic signal D2 to enhance the audio input signal A2 for outputting the bass-enhancement signal S21. The sound generated by the speaker 28 can cause the listener to sense the low frequency part B2 of the audio input signal A2.

In an embodiment, the first processing circuit 301 includes the filter unit 31, the amplifier 32 and the harmonic signal generator 39. The filter unit 31 receives the audio input signal A2, and extracts the low frequency part B2 of the audio input signal A2 from the audio input signal A2. In an embodiment, the filter unit 31 includes the low pass filter 311 having a cutoff frequency. The low pass filter 311 extracts the low frequency part B2 of the audio input signal A2, wherein the frequencies of the low frequency part B2 are less than the cutoff frequency of the low pass filter 311. The efficiency, the low frequency part B2 is reproduced by the speaker 28, is poor because of the small dimension of the speaker 28.

The amplifier 32 amplifies the low frequency part B2 of the audio input signal A2 to output the signal E2. In an embodiment, the amplifier 32 includes the preamplifier 321. The harmonic signal generator 39 generates the harmonic signal D2 according to the signal E2, and includes the harmonic wave generator 33 and the filter unit 34. The harmonic wave generator 33 generates the plural harmonic waves C2 of the signal E2, wherein the plural harmonic waves C2 includes the overtone C21. In an embodiment, the low pass filter 311 provides the low frequency part B2 of the audio input signal A2, and if the output variation of the harmonic wave generator 33 depends on the frequency of the signal E2 and does not depends on the level of the signal E2, amplifying the low frequency part B2 of the audio input signal A2 may be performed at the stage before the harmonic wave generator 33. In an embodiment, the preamplifier 321 boosts the low frequency part B2 of the audio input signal A2 into the signal E2; the harmonic wave generator 33 generates the plural harmonic waves C2 of the signal E2; the pitch of the plural harmonic waves C2 is still the same as that of the low frequency part B2 of the audio input signal A2 because the components in the higher frequency range of the audio input signal A2 are the harmonic waves of the audio input signal A2. In an embodiment, the harmonic wave generator 33 has a characteristic that the reduce amplitudes of the plural harmonic waves C2 are independent of the level of the low frequency part B2 of the audio input signal A2.

The filter unit 34 extracts the harmonic signal D2 from the plural harmonic waves C2, wherein the harmonic signal D2 includes the overtone C21. In an embodiment, the filter unit 34 includes the band pass filter 341 coupled to the harmonic wave generator 33; the band pass filter 341 extracts a suitable part from the output of the harmonic wave generator 33, wherein the suitable part includes the overtone C21. For instance, the band pass filter 341 has a low-side cutoff frequency and a high-side cutoff frequency, which are equal to the lower limit frequency and the upper limit frequency of the suitable part, respectively. The low-side cutoff frequency of the band pass filter 341 is selected to be equal to the cutoff frequency of the low pass filter 311, and the high-side cutoff frequency of the band pass filter 341 is selected to be a specific frequency, which is roughly one octave above the low-side cutoff frequency of the band pass filter 341.

The second processing circuit 40 of the audio processing circuit 211 includes the filter unit 41, the delay unit 42 and the mixer 43. The filter unit 41 removes an unwanted frequency part of the audio input signal A2 to output the signal F2. In an embodiment, the filter unit 41 includes the high pass filter 411; the high pass filter 411 receives the audio input signal A2 and is used to remove unwanted fundamental frequencies of the audio input signal A2. For instance, the high pass filter 411 extracts the part of the audio input signal A2, the frequency of which is higher than the cutoff frequency of the low pass filter 311. Under this condition, the unwanted fundamental frequencies are located within the low frequency part B2 of the audio input signal A2, and the cutoff frequency of the high pass filter 411 is selected to be equal to the cutoff frequency of the low pass filter 311.

The delay unit 42 delays the signal F2 to output the signal G2, whereby the delay between the signal G2 and the audio input signal A2 may match with that between the harmonic signal D2 and the audio input signal A2. The mixer 43 mixes the signal G2 and the harmonic signal D2 together to generate the bass-enhancement signal S21. In an embodiment, the mixer 43 includes the adder 431. The adder 431 adds the signal G2 and the harmonic signal D2 up to output the bass-enhancement signal S21. In an embodiment, the bass-enhancement signal S21 does not have the fundamental frequencies of the low frequency part B2 of the audio input signal A2, but has the pitches of the fundamental frequencies; i.e., the audio processing circuit 211 performs the psychoacoustic operation to obtain the bass-enhancement signal S21.

The audio compressing circuit 212 includes the third processing circuit 50 and the gain adjusting circuit 60. The third processing circuit 50 reduces a gain of the low frequency part P21 of the bass-enhancement signal S21 to output the signal P24. The gain adjusting circuit 60 adjusts a gain of the signal P24 to output the audio signal S22. The third processing circuit 50 includes the gain computer 51, the filter unit 52, the multiplier 54, the filter unit 53 and the mixer 55. The gain computer 51 determines the compression gain H21 according to the bass-enhancement signal S21. In an embodiment, if a level of the audio signal S22 goes beyond the threshold TH1 of the speaker 28, the gain computer 51 computes the value of the compression gain H21, which is used to cause the audio signal S22 down below the threshold TH1; otherwise the gain computer 51 set the value of the compression gain H21 to be the number 1.

The filter unit 52 receives the bass-enhancement signal S21, and extracts the low frequency part P21 of the bass-enhancement signal S21. In an embodiment, the filter unit 52 includes the low pass filter 521 having a cutoff frequency. The low pass filter 521 extracts the low frequency part P21 of the bass-enhancement signal S21. For instance, the cutoff frequency of the low pass filter 521 is selected to be equal to that of the low pass filter 311, and the frequencies of the low frequency part P21 are less than the cutoff frequency of the low pass filter 521. The efficiency, the low frequency part P21 is reproduced by the speaker 28, is poor when the dimension of the speaker 28 is small; under this condition, the level of the low frequency part P21 may be too high, which causes the level of the audio signal S22 to be higher than the threshold TH1, so that the third processing circuit 50 is used to compress the low frequency part P21. The multiplier 54 multiplies the low frequency part P21 of the bass-enhancement signal S21 by the compression gain H21 to output the signal P23. For instance, when the value of the compression gain H21 is less than 1, the signal P23 is correspondingly lower than the low frequency part P21 of the bass-enhancement signal S21.

The filter unit 53 removes an unwanted frequency part of the bass-enhancement signal S21 to output the signal P22. In an embodiment, the filter unit 53 includes the high pass filter 531; the high pass filter 531 receives the bass-enhancement signal S21 and is used to remove unwanted fundamental frequencies of the bass-enhancement signal S21. For instance, the high pass filter 531 filters out the low frequency part P21 of the bass-enhancement signal S21, or the high pass filter 531 extracts the part of the bass-enhancement signal S21, the frequency of which is higher than the cutoff frequency of the low pass filter 521. Under this condition, the unwanted fundamental frequencies are located within the low frequency part P21 of the bass-enhancement signal S21, and the cutoff frequency of the high pass filter 531 is selected to be equal to the cutoff frequency of the low pass filter 521. The mixer mixes the signal P22 with the signal P23 to output the signal P24.

The gain adjusting circuit 60 includes the gain computer 61 and the multiplier 62. The gain computer 61 is coupled to the mixer 55, and determines the compression gain H22 according to the signal P24. In an embodiment, the low frequency part P21 of the bass-enhancement signal S21 has a first amplitude, and the whole of the bass-enhancement signal S21 has a second amplitude; if the ratio of the first amplitude to the second amplitude is huge, the signal P24 will be lower than the threshold TH1 because the audio compressing circuit 212 compresses the low frequency part P21 first, so that the audio signal S22 may be lower than the threshold TH1 of the speaker 28 in the state that the high frequency part of the bass-enhancement signal S21 is not reduced. The multiplier 62 multiplies the signal P24 by the compression gain H22 to output the audio signal S22, wherein the gain computer 61 adjusts the compression gain H22, whereby each level of the audio signal S22 is lower than the threshold TH1 of the speaker 28. In an embodiment, the audio compressing circuit 212 includes the third processing circuit 50, and the gain adjusting circuit 60 is omitted. Under this condition, the signal P24 is the audio signal S22, and the coupling relationship of the abovementioned circuit may be referred to FIG. 1.

Figure 2:
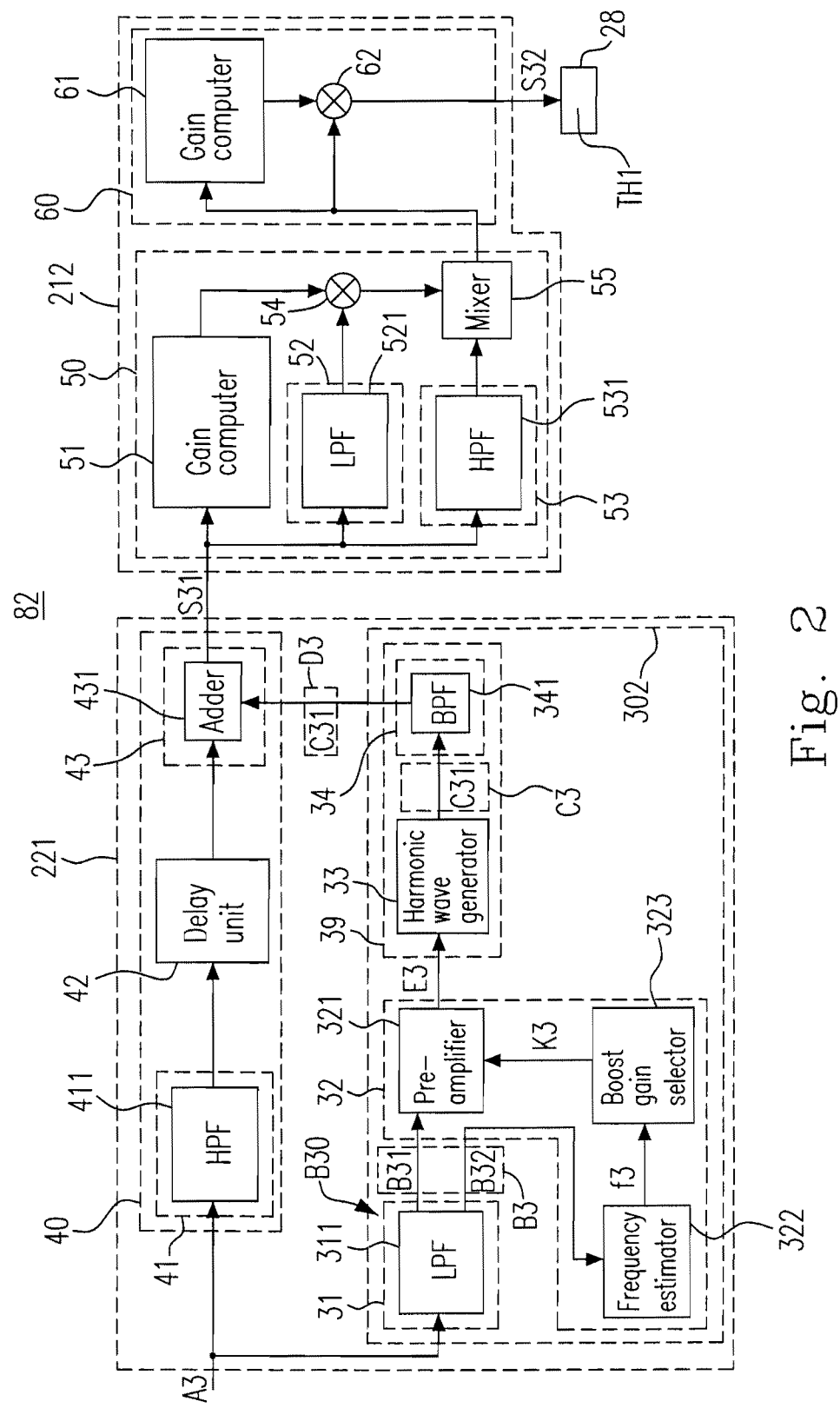
FIG. 2 is a schematic diagram showing an apparatus for processing an audio input signal according to the second embodiment of the present invention.

Please refer to FIG. 2, which is a schematic diagram showing the apparatus 82 for processing the audio input signal A3 according to the second embodiment of the present invention. As shown, the apparatus 82 includes the audio processing circuit 221 and the audio compressing circuit 212. Comparing the embodiment in FIG. 2 with that in FIG. 1, most functions and operation principles of the circuits are similar or the same, so that the descriptions for the portion of the same or similar circuits are omitted. In FIG. 2, the first processing circuit 302 includes the filter unit 31, the amplifier 32 and the harmonic signal generator 39. The filter unit 31 receives the audio input signal A3, extracts the low frequency part B30 of the audio input signal A3 from the audio input signal A3, and outputs the signal B3. In an embodiment, the filter unit 31 includes the low pass filter 311 having a cutoff frequency. The low pass filter 311 removes the component of the audio input signal A3 having a frequency range, wherein the frequency range includes plural frequencies being higher than the cutoff frequency of the low pass filter 311. The signal B3 includes the two sub-signals B31 and B32. In an embodiment, each of the sub-signals B31 and B32 is the low frequency part B30 of the audio input signal A3 selected by the low pass filter 311.

The amplifier 32 is coupled between the filter unit 31 and the harmonic wave generator 33, amplifies the low frequency part B30 of the audio input signal A3 to output the signal E3, and includes the frequency estimator 322, the boost gain selector 323 and the preamplifier 321. The frequency estimator 322 is coupled to the low pass filter 311, and estimates the dominant frequency f1 of the low frequency part B30 of the audio input signal A3. The boost gain selector 323 is coupled to the 322, and selects the boost gain K3 according to the dominant frequency f1. The preamplifier 321 uses the boost gain K3 to amplify the low frequency part B30 of the audio input signal A3 for outputting the signal E3. The harmonic signal generator 39 generates the harmonic signal D3 according to the signal E3, and includes the harmonic wave generator 33 and the filter unit 34. The harmonic wave generator 33 generates the plural harmonic waves C3 of the signal E3, wherein the plural harmonic waves C3 includes the overtone C31. In an embodiment, the level of the plural harmonic waves C3 is almost equal to that of the low frequency part B30 of the audio input signal A3.

The filter unit 34 extracts the harmonic signal D3 from the plural harmonic waves C3. In an embodiment, the filter unit 34 includes the band pass filter 341; the band pass filter 341 extracts a suitable part from the output of the harmonic wave generator 33. The audio compressing circuit 212 includes the third processing circuit 50 and the gain adjusting circuit 60. In order to ensure that each level of the audio signal S32 is lower than the threshold TH1 of the speaker 28, the gain adjusting circuit 60 reduces the gain of the whole of the output of the third processing circuit 50.

Figure 3:
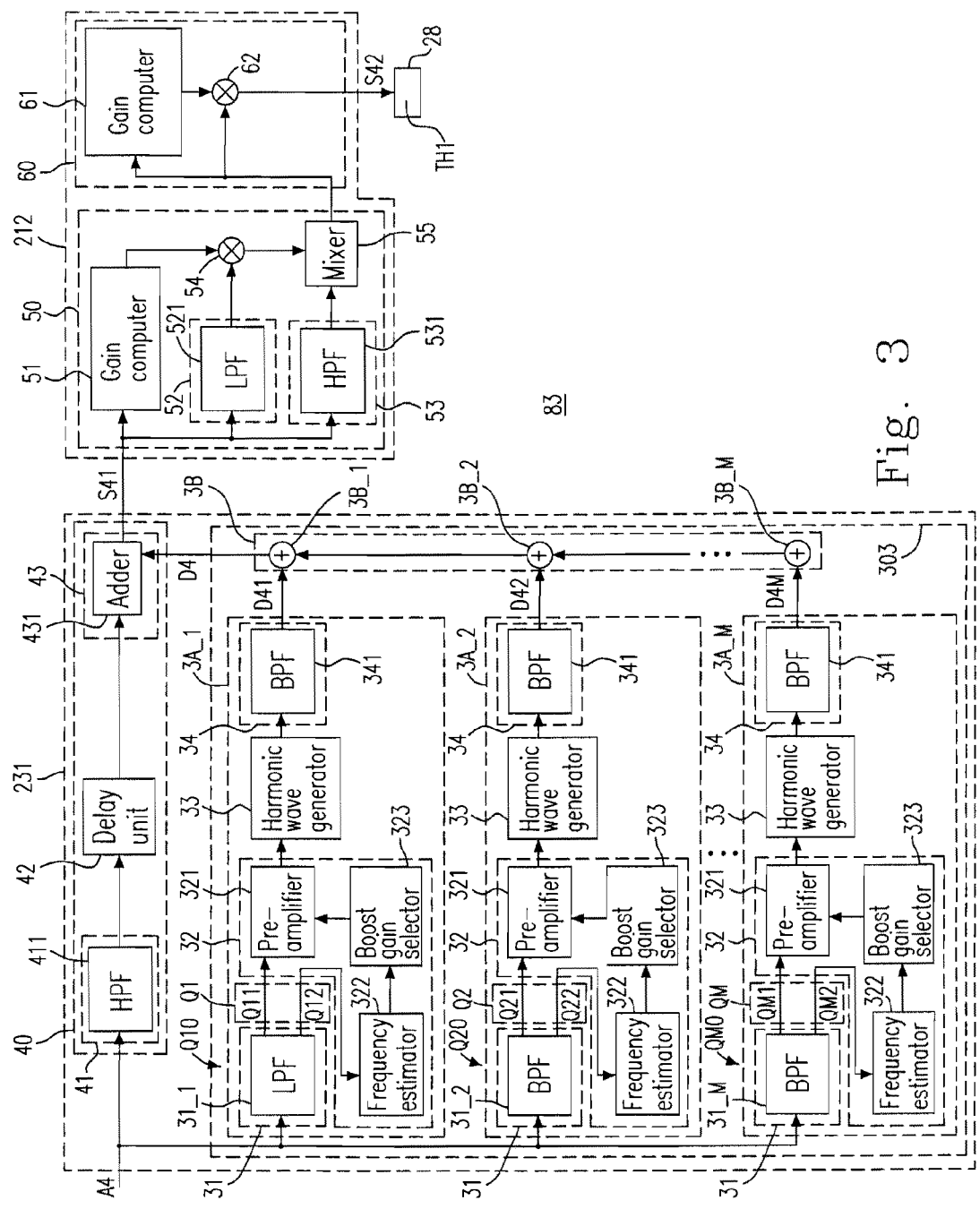
FIG. 3 is a schematic diagram showing an apparatus for processing an audio input signal according to the third embodiment of the present invention.

Please refer to FIG. 3, which is a schematic diagram showing the apparatus 83 for processing the audio input signal A4 according to the third embodiment of the present invention. As shown, the apparatus 83 includes the audio processing circuit 231 and the audio compressing circuit 212. The audio processing circuit 231 outputs the bass-enhancement signal S41 in response to the audio input signal A4. The audio compressing circuit 212 outputs the audio signal S42 in response to the bass-enhancement signal S41. The audio processing circuit 231 includes the first processing circuit 303 and the second processing circuit 40, each of which receives the audio input signal A4. The first processing circuit 301 uses the low frequency part of the audio input signal A4 to output the harmonic signal D4. The second processing circuit 40 uses the harmonic signal D4 to enhance the audio input signal A4 for outputting the bass-enhancement signal S41.

The first processing circuit 303 splits the low frequency part of the audio input signal A4 into the plural low frequency sub-parts Q10, Q20, . . . and QM0, wherein the low frequency sub-part Q10 is the lowest frequency sub-part of the plural low frequency sub-parts Q10, Q20, . . . and QM0. The first processing circuit 303 includes the plural processing units 3A_1, 3A_2, . . . and 3A_M, and the mixer 3B. The plural processing units 3A_1, 3A_2, . . . and 3A_M respectively process the corresponding plural low frequency sub-parts Q10, Q20, . . . and QM0 to output the plural harmonic sub-signals D41, D42, . . . and D4M. The mixer mixes the plural harmonic sub-signals D41, D42, . . . and D4M to generate the harmonic signal D4. In an embodiment, the mixer includes the plural adders 3B_1, 3B_2, . . . and 3B_M adding the plural harmonic sub-signals D41, D42, . . . and D4M up for outputting the harmonic signal D4.

Any of the plural processing units 3A_1, 3A_2, . . . and 3A_M may be the same or similar as the first processing circuit 301 in FIG. 1 or the first processing circuit 302 in FIG. 2.

If at least one embodying configuration of the plural processing units 3A_1, 3A_2, . . . and 3A_M may be the same or similar as the first processing circuit 301 in FIG. 1 or the first processing circuit 302 in FIG. 2, the plural processing units 3A_1, 3A_2, . . . and 3A_M further have the following embodiments.

The filter units 31 of the plural processing units 3A_1, 3A_2, . . . and 3A_M respectively includes the low pass filter 31_1, the band pass filter 31_2, . . . and the band pass filter 31_M. The signal Q1 output by the low pass filter 31_1 includes two sub-signals Q11 and Q12, each of which may be the low frequency sub-part Q10. The signal Q2 output by the low pass filter 31_2 includes two sub-signals Q21 and Q22, each of which may be the low frequency sub-part Q20. The rest may be deduced by analogy, and the signal QM output by the low pass filter 31_M includes two sub-signals QM1 and QM2, each of which may be the low frequency sub-part QM0.

For each amplifier 32 such as the one in the processing unit 3A_1, the frequency estimator 322 of the processing unit 3A_1 estimates a dominant frequency of the low frequency sub-part Q10. The boost gain selector 323 of the processing unit 3A_1 determines a boost gain according to the dominant frequency. The preamplifier 321 of the processing unit 3A_1 uses the boost gain to amplify the low frequency sub-part Q10. Therefore, the respective boost gain selectors of the plural processing units 3A_1, 3A_2, . . . and 3A_M may apply different gains to the respective preamplifiers of the plural processing units 3A_1, 3A_2, . . . and 3A_M.

Because the frequency range of the filter unit 31 used to extract the each low frequency sub-part is small, less intermodulation distortion occurs during the generation of the harmonic waves. When the low frequency part of the audio input signal A4 is not split, there may be more than one component in the frequency range of the low frequency part, and some unwanted frequencies are generated by operating those components of the frequencies in the low frequency part (e.g. the nonlinear operation). These unwanted frequencies are not the harmonic frequencies of the audio input signal A4, and the phenomenon thereof is called the intermodulation distortion. There are other benefits of the frequency band division, the result variation output by the frequency estimator 322 of the processing unit is smaller and accurate, and the output level of the filter unit 34 of the processing unit is very close to that of the filter unit 31 of the processing unit.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An apparatus for processing an audio input signal, comprising:
   an audio processing circuit to receive the audio input signal, and to enhance a first frequency part of the audio input signal to output a bass-enhancement signal; and
   an audio compressing circuit, coupled to the audio processing circuit, to reduce a gain of a second frequency part of the bass-enhancement signal to output an audio output signal.

2. The apparatus of claim 1, wherein the audio processing circuit comprises:
   a first processing circuit to generate a harmonic signal according to the first frequency part of the audio input signal, wherein the harmonic signal includes an overtone of the first frequency part; and
   a second processing circuit to enhance the audio input signal according to the harmonic signal to generate the bass-enhancement signal.

3. The apparatus of claim 2, wherein the first processing circuit comprises:
   a low pass filter to filter the audio input signal to generate the first frequency part of the audio input signal;
   an amplifier to amplify the low frequency part of the audio input signal to output an amplified signal; and
   a harmonic signal generator to generate the harmonic signal according to the amplified signal.

4. The apparatus of claim 2, wherein the first frequency part comprises a plurality of low frequency sub-parts, and the first processing circuit comprises:
   a plurality of processing units to respectively process the corresponding low frequency sub-parts to output a plurality of harmonic sub-signals; and
   a mixer to mix the plurality of harmonic sub-signals to generate the harmonic signal.

5. The apparatus of claim 2, wherein the second processing circuit comprises:
   a first filter to remove an unwanted frequency part of the audio input signal to output a filtered signal;
   a delay unit to delay the filtered signal to output a delayed and filtered signal; and a mixer to mix the delayed and filtered signal and the harmonic signal to generate the bass-enhancement signal.

6. The apparatus of claim 1, wherein the audio compressing circuit comprises:
a third processing circuit to reduce the gain of the second frequency part of the bass-enhancement signal to output a processed signal; and
a gain adjusting circuit to adjust a gain of the processed signal to output the audio output signal.

7. The apparatus of claim 6, wherein the third processing circuit comprises:
a gain computer to determine a compression gain according to the bass-enhancement signal;
a low pass filter to generate the second frequency part of the bass-enhancement signal;
a first multiplier to multiplying the second frequency part of the bass-enhancement signal by the compression gain;
a high pass filter to filter out the second frequency part of the bass-enhancement signal to output a high-pass filtered signal; and
a mixer to mix the output from the first multiplier with the high-pass filtered signal to output the processed signal.

8. The apparatus of claim 1, wherein both of the first frequency part and the second frequency part are low frequency parts.

9. A method for processing an audio input signal, the method comprising:
receiving the audio input signal, and enhancing a first frequency part of the audio input signal to output a bass-enhancement signal; and
compressing a second frequency part of the bass-enhancement signal to output a compressed signal such that a gain of the second frequency part of the bass-enhancement signal is reduced.

10. The method of claim 9, wherein the step of enhancing the first frequency part of the audio input signal comprises:
generating a harmonic signal according to the first frequency part of the audio input signal, wherein the harmonic signal includes an overtone of the first frequency part of the audio input signal; and
utilizing the harmonic signal to enhance the audio input signal to generate the bass-enhancement signal.

11. The method of claim 10, wherein the step of generating the harmonic signal comprises:
extracting the first frequency part of the audio input signal from the audio input signal; and
generating the harmonic signal according to the first frequency part of the audio input signal.

12. The method of claim 10, wherein the first frequency part comprises a plurality of low frequency sub-parts.

13. The method of claim 12, wherein the step of enhancing the first frequency part of the audio input signal comprises:
extracting the plurality of low frequency sub-parts of the audio input signal from the audio input signal; and
respectively processing the plurality of the low frequency sub-parts to output a plurality of harmonic sub-signals; and
generating the harmonic signal according to the harmonic sub-signals.

14. The method of claim 9, further comprising:
adjusting a gain of the compressed signal to output an audio output signal such that a whole of the audio output signal is lower than a threshold.

15. The method of claim 10, wherein the step of utilizing the harmonic signal to enhance the audio input signal further comprises:
filtering out an unwanted frequency part of the audio input signal to output a filtered signal;
delaying the filtered signal to output a delayed and filtered signal; and
mixing the delayed and filtered signal and the harmonic signal to generate the bass-enhancement signal.

16. The method of claim 9, wherein the step of compressing the second frequency part of the bass-enhancement signal further comprises:
reducing the gain of the second frequency part of the bass-enhancement signal to output a first processed signal; and
adjusting a gain of the first processed signal to output the audio output signal.

17. The method of claim 9, wherein the first frequency part and the second frequency part are low frequency parts.

18. The method of claim 9, wherein the first frequency part and the second frequency part are substantially the same.

* * * * *